US006967877B2

(12) United States Patent
Chou

(10) Patent No.: US 6,967,877 B2
(45) Date of Patent: Nov. 22, 2005

(54) TEMPERATURE DETECTING CIRCUIT FOR CONTROLLING A SELF-REFRESH PERIOD OF A SEMICONDUCTOR MEMORY DEVICE

(75) Inventor: Chung-Cheng Chou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 62 days.

(21) Appl. No.: 10/658,833

(22) Filed: Sep. 9, 2003

(65) Prior Publication Data

US 2005/0052919 A1 Mar. 10, 2005

(51) Int. Cl.[7] .................................................. G11C 7/00
(52) U.S. Cl. .................................. 365/189.09; 365/211
(58) Field of Search ............................ 365/189.09, 211; 361/103; 327/143

(56) References Cited

U.S. PATENT DOCUMENTS 4,851,954 A * 7/1989 Surig ......................... 361/103
5,485,111 A * 1/1996 Tanimoto .................... 327/143

* cited by examiner

*Primary Examiner*—Vu A. Le
(74) *Attorney, Agent, or Firm*—Thomas, Kayden, Horstemeyer & Risley

(57) ABSTRACT

Systems for providing a temperature detecting circuit includes seven transistors and six resistors. In a preferred embodiment, one of the seven transistors is configured as an enabling element and the others form two comparators. The six resistors form three voltage dividers with output varying based upon changing temperature. Two comparators are included that sense the difference between the outputs of two of the voltage dividers, and generate a corresponding 2-bit detection signal by which the refresh period is determined. Other systems and methods are also provided.

24 Claims, 6 Drawing Sheets

TEMPERATURE DETECTING CIRCUIT FOR CONTROLLING A SELF-REFRESH PERIOD OF A SEMICONDUCTOR MEMORY DEVICE

BACKGROUND

The present invention relates to a temperature detecting circuit and particularly to a temperature detecting circuit for controlling a self-refresh period of a semiconductor memory device.

A dynamic random access memory (hereinafter called "DRAM") stores data by storing an electric charge in a memory cell capacitor. As time passes, the electric charge stored in that capacitor leaks through a substrate or the like, making it difficult to permanently store data. It is, therefore, necessary to perform a refresh operation, that is, continuously rewrite the data at a pre-determined interval.

Generally, the refresh operation is achieved by applying an external control signal. A refresh operation which is achieved by an internal control signal generated inside the memory is called a "self-refresh function."

With the recent expansion of applications for DRAM, the demand for DRAM for use with devices or equipment with a battery-backup function has increased. Thus, it is desirable that DRAMs have a self-refresh function that requires minimal power.

As a typical example of a conventional DRAM with a self-refresh function, a prior art DRAM as illustrated in Electronic Information and Communication Society, Technical and Research Report, Vol. 91, No. 64, (SDM91-10-22), pp. 51–57, is described with reference to FIG. 1 showing a circuit concept diagram and FIG. 2 showing a signal waveform diagram.

The operation of the DRAM is described briefly as follows.

A precharge signal OP precharges 1 k bit dummy memory cells. When this occurs, ϕE assumes logic level "H" to enable a timer which generates a time T1. A refresh operation is carried out a predetermined number of times (NCYC) during the period T1. Thereafter, the signals ϕP, ϕE are reset to logic level "L." Once the signals have been reset, the charge at node VN of the dummy memory cell begins leaking. When the voltage at node VN reaches a reference level VREF, ϕE and ϕP assume logic level "H" again. Then, the above mode of operation is repeated. The period of time where leaking is seen at node VN is called "self-refresh interval". However, when the temperature is lower, the self-refresh function in a DRAM experiences a prolonged self-refresh interval.

Consumption current I of DRAMs during refresh may be represented as shown below where IAC is consumption current under enabled condition and IDC is one under standby (not-enabled) condition:

$$I=IAC/T+IDC$$

The consumption current I during refresh decreases as the refresh interval T becomes longer.

The conventional DRAM having a self-refresh function utilizes the temperature dependency of the leak speed of the charges stored in the dummy memory cells in order to reduce the consumption current at low temperatures to a minimum by extending the self-refresh interval with low temperatures.

FIG. 3 illustrates the relationship of the self-refresh interval during the self-refresh function and the data hold time of a DRAM in regard to temperature. The data hold time of memory cells of DRAMs is determined by the data hold time of the memory cell which assumes the shortest data hold time, out of a number of the memory cells. When temperature increases, the data hold time of some of the memory cells becomes very short. As shown in FIG. 3, in some instances, the temperature dependency of the data hold time is larger than that of the self-refresh interval.

Japanese Patent Laid-open 3-207084 discloses a dynamic random access memory device having a refresh interval which is variable with the ambient temperature. This device is described with reference to FIG. 4. Resistor R1 and variable resistor VR1 are connected in series between power supply voltage VCC and a ground level. Similarly, resistors R2, R3, R4 are connected between the power supply voltage VCC and ground level. A signal at the junction of the resistors R2, R3 is supplied to two comparators 41 and 42. A signal at the junction of the resistors R2, R3 is supplied to the comparator 41 via node N1, whereas a signal at the junction of the resistors R3, R4 is supplied to the comparator 2 via node N2. Outputs of the comparators 41 and 42 are represented as S1, S2. A detector 3 is suggested which uses the output S1 at 60° C. as a detection signal and the output S2 at 40° C. as a detection signal.

FIG. 5 illustrates a MOS transistor temperature detecting circuit as disclosed in U.S. Pat. No. 5,095,227. A p-channel MOS transistor M5 operated in the subthreshold region is used as a current supply 510. The source of the P-channel MOS transistor M5 is connected to the first power supply line 511, the drain of M5 is connected to a third node N3, and the gate M5 is connected to a current setting circuit 530 through node N2. One terminal of the polycrystalline silicon resistor 520 is connected to the third node N3, and the other terminal is connected to the second power supply line 512. The current setting circuit 530 includes two p-channel MOS transistors and two n-channel MOS transistors. The source of a first p-channel MOS transistor M1 is connected to the first power supply line 511; the gate is connected to the second power supply line 512; and the drain is connected to the first node N1. The drain current ID1 of M1 supplies the first node N1. The drain and gate of a second n-channel MOS transistor M2 are commonly connected to the first node N1, and the source is connected to the second power supply line 512. The ratio between the geometrical sizes of the first and second MOS transistors is to satisfy the formula, W1<<W2 (L1-L2), so that the second MOS transistor M2 should be operable in the subthreshold region. The M2 transistor is geometrically larger than the M1 transistor. The drain of a third n-channel MOS transistor M3 is connected to the second node N2; the source is connected to the second power supply line 512; and the gate is connected to the first node N1 so that it should have the same bias voltage as that of the second MOS transistor. Accordingly, the third MOS transistor M3 is operable in the subthreshold region regardless of the channel width thereof. The M3 transistor is geometrically smaller than the M2 transistor. The gate and drain of a fourth p-channel MOS transistor M4 are commonly connected to the second node N2, and the source of it is connected to the first power supply line 511. The ratio between the geometrical sizes of the third and fourth MOS transistors M3, M4 satisfies the formula W3<<W4(L3-L4), so that the said fourth MOS transistor M4 should be operable in the subthreshold region. The M4 transistor is geometrically larger than the M3 transistor. The gate of p-channel MOS transistor M5 of current supply 510 is connected to the gate of the fourth MOS transistor M4. Accordingly, M5 is made to have the same gate voltage as that of the fourth MOS transistor M4, such that M5 is made operable in the subthreshold region. The ratio between the geometrical sizes of the fourth and fifth MOS transistors M4, M5, satisfies the formula W4>>W5(L4-L5). The drain of the fifth MOS transistor has a negligible amount of current compared with the drain current of the first MOS transistor, especially in light of the geometrical sizes of the second to fifth MOS transistors. Also, the current supply is not affected by temperature variation and the method of manufacturing. The output voltage VO can be defined by the following formula:

$$VO=ID5\times RT(K)$$

where RT(K) represents the resistance values of the polycrystalline silicon for different temperature levels.

A conventional temperature detecting circuit is shown in FIG. 6. The circuit is composed of a CMOS type differential amplifier and voltage dividers of resistors which generate the input signals to the amplifier. The resistors used are formed of N-well and Poly-Si. FIG. 7 is a timing diagram for the detecting circuit shown in FIG. 6.

However, conventional temperature detecting circuits must be activated by control signals. Further, one temperature detecting circuit is used to detect only one of the predetermined temperatures where transition of the refresh rate is triggered. Thus, more than one circuit must be used if there are several transition temperatures of the refresh rate. This increases the layout area and complexity of the refresh controller in a DRAM.

SUMMARY OF THE INVENTION

Accordingly, an object of the present invention is to provide an apparatus for controlling the refresh period of a DRAM with a temperature detecting circuit, which occupies a small circuit area and is easy to design.

To achieve foregoing and other objects, the present invention provides a temperature detecting circuit. In a preferred embodiment, the temperature detecting circuit includes a first, second and third voltage divider, each of which comprises resistors having temperature-dependent resistances, outputting a first, second and third voltage, and a voltage comparator comparing the first voltage with the second voltage, and the first voltage with the third voltage and respectively outputting a first and second signal according to the comparison results.

Another preferred embodiment of present invention provides a circuit for controlling a self-refresh period of a semiconductor memory device. The circuit includes a pulse generating circuit which outputs a periodic pulse train in response to an external control signal, a frequency-dividing circuit which outputs a plurality of pulse trains having different periods from each other by frequency-dividing said periodic pulse train output by said pulse generating circuit, a temperature detecting circuit which detects an ambient temperature of said memory device and outputs a temperature detection signal when said ambient temperature reaches a predetermined temperature level, a pulse selection circuit which outputs a self-refresh master clock by selecting one of said pulse trains in response to said temperature detection signal and said voltage detection signal, and a voltage detection circuit which detects a power supply voltage applied to said memory device and outputs a voltage detection signal when said power supply voltage reaches a predetermined voltage level. The temperature detection circuit preferably includes a first transistor of a first type having a source coupled to receive a first voltage, a second transistor of the first type having a gate coupled to a gate of the first transistor, a source coupled to receive the first voltage and a drain outputting a first bit of the temperature detection signal, a third transistor of the first type having a gate coupled to the gate of the first transistor, a source coupled to receive the first voltage and a drain outputting a second bit of the temperature detection signal, a fourth transistor of a second type having a drain coupled to a drain of the first transistor, a fifth transistor of the second type having a drain coupled to the drain of the second transistor and a source coupled to the source of the fourth transistor, a sixth transistor of the second type having a drain coupled to the drain of the third transistor and a source coupled to the source of the fourth transistor, a seventh transistor of the second type having a drain coupled to the drain of the fourth transistor, a gate coupled to receive an enable signal and a source coupled to receive a second voltage, and six resistors respectively coupled between the gate of the fourth transistor and the source of the first transistor, the gate of the fourth transistor and the source of the seventh transistor, the gate of the fifth transistor and the source of the first transistor, the gate of the fifth transistor and the source of the seventh transistor, the gate of the sixth transistor and the source of the first transistor, the gate of the sixth transistor and the source of the seventh transistor.

Still another preferred embodiment of the present invention provides a circuit for controlling a self-refresh period of a semiconductor memory device. The circuit preferably includes a temperature detecting circuit outputting a temperature detection signal, an internal period selector receiving a plurality of signals representing different periods and outputting one of the signals according to the temperature detection signal from the temperature detecting circuit, a plurality of timers, each generating one of the signals representing the different periods, and a self-refresh controller determining a refresh period according to the signal output from the internal period selector. The temperature detecting circuit preferably includes a first transistor of a first type having a source coupled to receive a first voltage, a second transistor of the first type having a gate coupled to a gate of the first transistor, a source coupled to receive the first voltage and a drain outputting a first bit of the temperature detection signal, a third transistor of the first type having a gate coupled to the gate of the first transistor, a source coupled to receive the first voltage and a drain outputting a second bit of the temperature detection signal, a fourth transistor of a second type having a drain coupled to a drain of the first transistor, a fifth transistor of the second type having a drain coupled to the drain of the second transistor and a source coupled to the source of the fourth transistor, a sixth transistor of the second type having a drain coupled to the drain of the third transistor and a source coupled to the source of the fourth transistor, a seventh transistor of the second type having a drain coupled to the drain of the fourth transistor, a gate coupled to receive an enable signal and a source coupled to receive a second voltage, and six resistors respectively coupled between the gate of the fourth transistor and the source of the first transistor, the gate of the fourth transistor and the source of the seventh transistor, the gate of the fifth transistor and the source of the first transistor, the gate of the fifth transistor and the source of the seventh transistor, the gate of the sixth transistor and the source of the first transistor, the gate of the sixth transistor and the source of the seventh transistor.

BRIEF DESCRIPTION OF THE DRAWINGS

The present invention will become more fully understood from the detailed description given hereinbelow and the accompanying drawings, given by way of illustration only and thus not intended to limit the present invention.

DETAILED DESCRIPTION OF THE INVENTION

Disclosed herein are systems and methods for a temperature detecting circuit for controlling a self-refresh period of a semiconductor memory device. To facilitate description of the inventive system, an example system that can be used to implement the temperature detecting circuit is discussed with reference to the figures. Although this system is described in detail, it will be appreciated that this system is provided for purposes of illustration only and that various modifications are feasible without departing from the inventive concept. After the example system has been described, an example of operation of the system will be provided to explain the manner in which the system can be used to provide a temperature detecting circuit.

Figure 1:
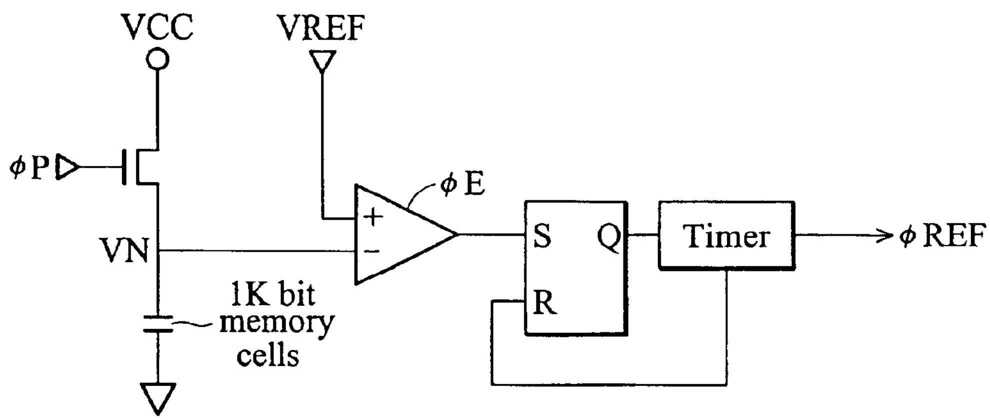
FIG. 1 depicts a schematic diagram of a conventional DRAM with a self-refresh function.
Figure 2:
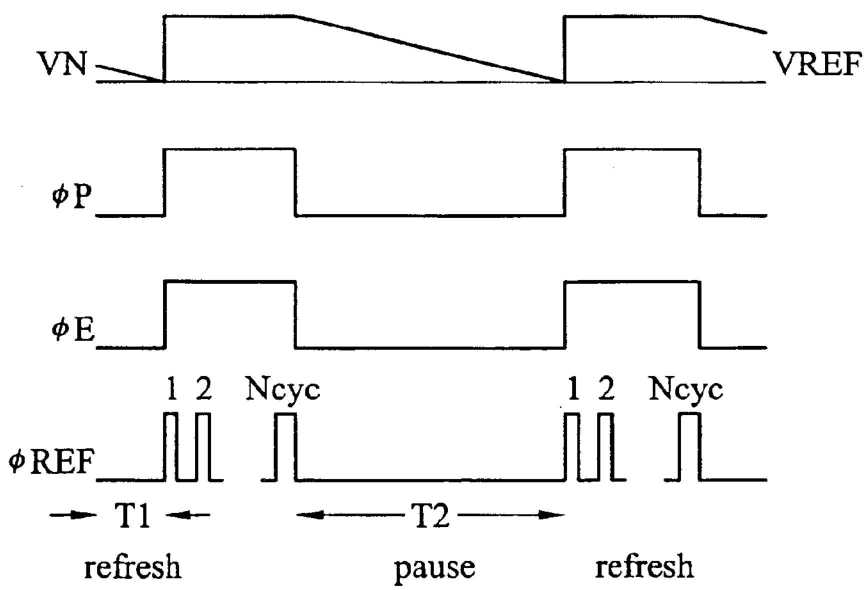
FIG. 2 depicts a schematic diagram of a signal waveform diagram of the circuit in FIG. 1.
Figure 3:
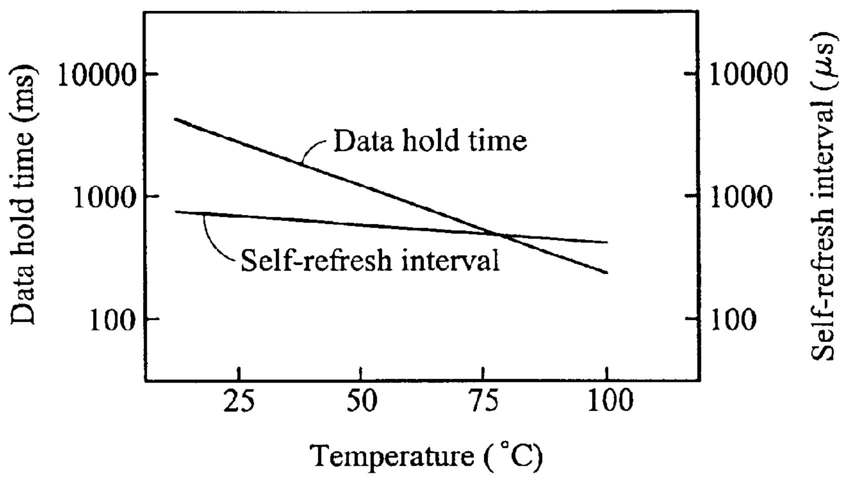
FIG. 3 depicts a graph that illustrates the relationship of the self-refresh interval during the self-refresh function and the data hold time of a DRAM with regard to temperature in the circuit of FIG. 1.
Figure 4:
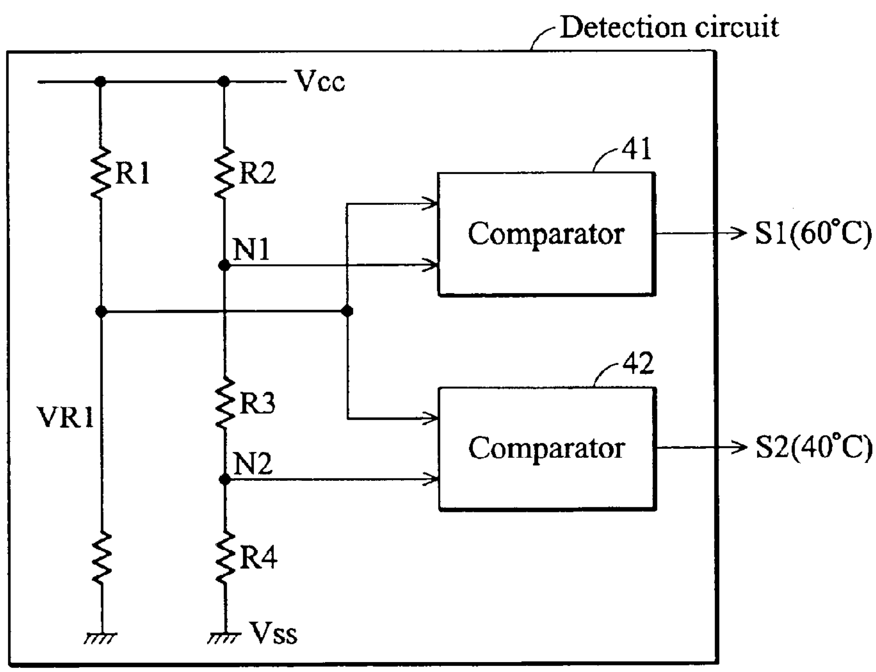
FIG. 4 depicts a schematic diagram of a dynamic random access memory device having a refresh interval which is variable with ambient temperature as disclosed in Japanese Patent Laid-open 3-207084.
Figure 5:
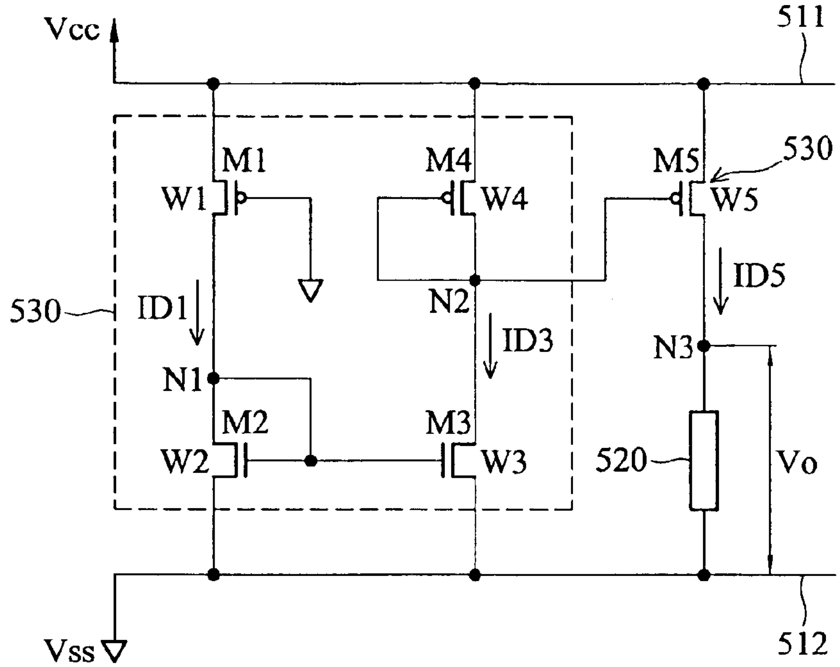
FIG. 5 depicts a schematic diagram of a MOS transistor temperature detecting circuit as disclosed in U.S. Pat. No. 5,095,227.
Figure 6:
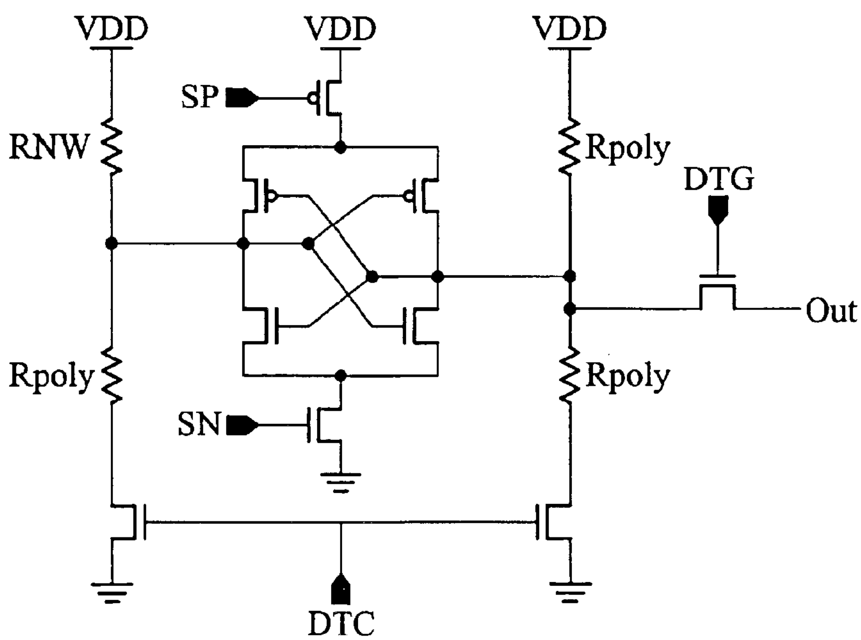
FIG. 6 depicts a schematic diagram of a conventional temperature detecting circuit.
Figure 7:
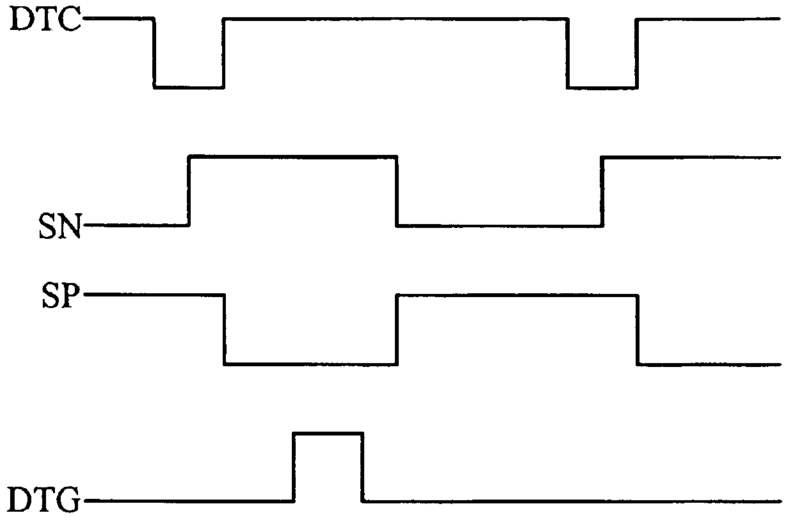
FIG. 7 depicts a timing diagram of the circuit in FIG. 6.
Figure 8:
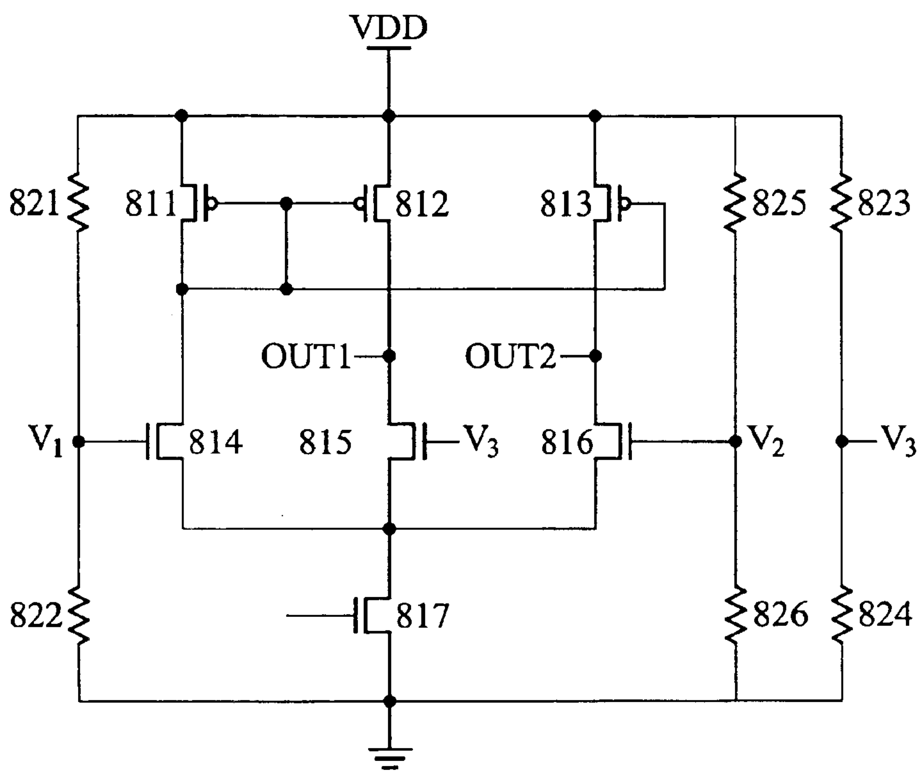
FIG. 8 depicts a schematic diagram of a temperature detecting circuit according to a preferred embodiment of the invention.

FIG. 8 shows a temperature detecting circuit according to a preferred embodiment of the invention. The circuit preferably includes a voltage comparator composed of seven transistors 811~817 and three voltage dividers respectively composed of resistors 821 and 822, 825 and 826, and 823 and 824. The resistors 821~826 have temperature-dependent resistances so that the voltage dividers respectively output voltages $V_1$, $V_2$ and $V_3$ divided from $V_{dd}$ and having magnitudes dependent on the ambient temperature. The voltage comparator compares the voltage V1 with the voltage V2, and the voltage V1 with the voltage V3, and respectively outputs signals OUT2 and OUT1 according to the comparison results.

The pMOS transistor 811 has a source coupled to receive a voltage $V_{dd}$. The pMOS transistor 812 has a gate coupled to a gate of the pMOS transistor 811, a source coupled to receive the voltage $V_{dd}$ and a drain outputting a first bit OUT1 of a temperature detection signal TDS. The pMOS transistor 813 has a gate coupled to the gate of the pMOS transistor 811, a source coupled to receive the voltage $V_{dd}$ and a drain outputting a second bit OUT2 of the temperature detection signal TDS. The nMOS transistor 814 has a drain coupled to a drain of the pMOS transistor 811. The nMOS transistor 815 has a drain coupled to the drain of the pMOS transistor 812 and a source coupled to the source of the nMOS transistor 814. The nMOS transistor 816 has a drain coupled to the drain of the pMOS transistor 813 and a source coupled to the source of the nMOS transistor 814. The nMOS transistor 817 has a drain coupled to the drain of the nMOS transistor 814, a gate coupled to receive an enable signal EN (not shown) and a source coupled to receive a ground voltage. The six resistors 821~826 are respectively coupled between the gate of the nMOS transistor 814 and the source of the pMOS transistor 811, the gate of the nMOS transistor 814 and the source of the nMOS transistor 817, the gate of the nMOS transistor 815 and the source of the pMOS transistor 811, the gate of the nMOS transistor 815 and the source of the nMOS transistor 817, the gate of the nMOS transistor 816 and the source of the pMOS transistor 811, the gate of the nMOS transistor 816 and the source of the nMOS transistor 817.

Each pair of the resistors 821 and 822, 823 and 824, and 825 and 826 forms a voltage divider. The resistors 821, 824, 825 and 826 are made of poly-silicon and have a temperature coefficient smaller than that of the resistors 822 and 823 which are the parasitic resistances of an N well. Thus, when the ambient temperature increases, the voltage V1 increases while the voltage V3 decreases. On the contrary, when the ambient temperature decreases, the voltage V1 decreases while the voltage V3 increases. The voltage V2 is fixed due to the resistors 825 and 826 having the same temperature coefficient. More specifically, when the ambient temperature is lower than 50° C., the relationship between the voltages V1, V2 and V3 is V1<V2<V3, which results in the bits OUT1 and OUT2 having a low logic level. As the ambient temperature increases higher than 50° C., the voltage V1 increases higher than the voltage V2 but still lower than the voltage V3, which results in the bits OUT1 and OUT2 having a low and high logic level respectively. As the ambient temperature further increases higher than 70° C., the voltage V1 increases higher than the voltage V2 but still lower than the voltage V3, which results in the bits OUT1 and OUT2 having a high logic level. Thus, the temperature detection signal identifies the range in which the current ambient temperature is by carrying different data bits.

Figure 9:
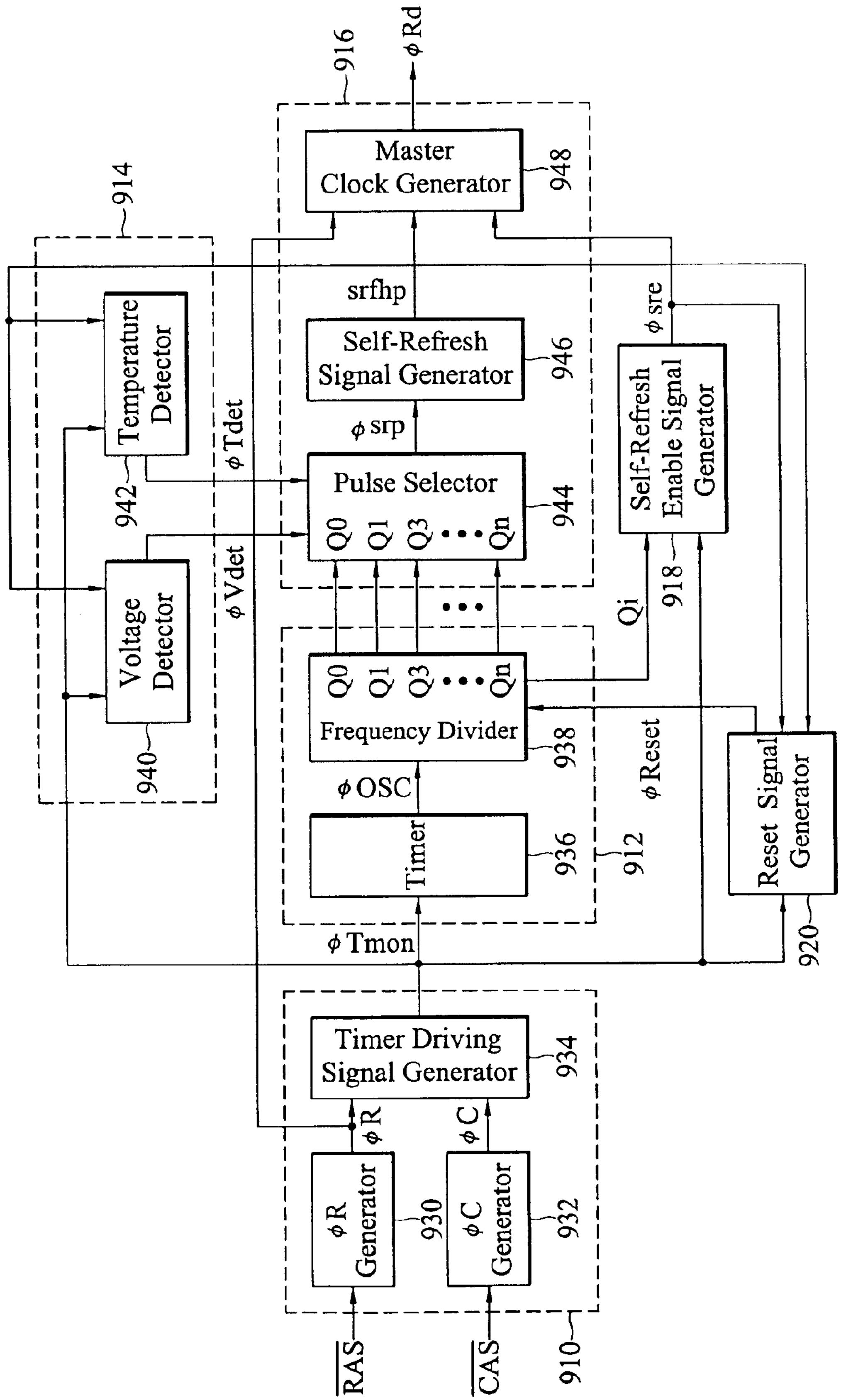
FIG. 9 depicts a block diagram of a self-refresh period control circuit according to a preferred embodiment of the invention.

FIG. 9 depicts a block diagram of a self-refreshing period control circuit according to a preferred embodiment of the invention. Referring to FIG. 9, a self-refresh period control circuit includes a detecting circuit 910 for outputting a timer driving signal $\phi T_{mon}$ to enable timer response to the inverse low address strobe signal RAS and a inverse column address strobe signal CAS. A pulse train generating circuit 912 is provided for outputting a number of pulse trains Q0-QN having different periods from each other responding to the timer driving signal $\phi T_{mon}$. A temperature and voltage detecting circuit 914 is provided for outputting a temperature detection signal ϕTdet by detecting that the ambient temperature of the memory device has reached a predetermined level and a voltage detection signal ϕVdet by detecting that the power supply voltage supplied to the memory device has reached a predetermined level. A master clock generating circuit 916 is provided for generating the new periodic combination pulse trains by combining the pulse trains output from the pulse train generating circuit 912 and for outputting any one of the new periodic combination pulse trains as a master clock signal ϕRd of the self-refresh operation. A self-refresh enable signal generator 918 is provided for outputting a self-refresh enable signal ϕsre permitting a generation of the master clock signal ϕRd with a predetermined time delay after the timer driving signal $\phi T_{mon}$ is activated. A reset signal generator 920 is provided for outputting a reset signal ϕReset under a predetermined condition. In a preferred embodiment, the temperature detector 942 provides similar functionality same as circuit shown in FIG. 8.

Figure 10:
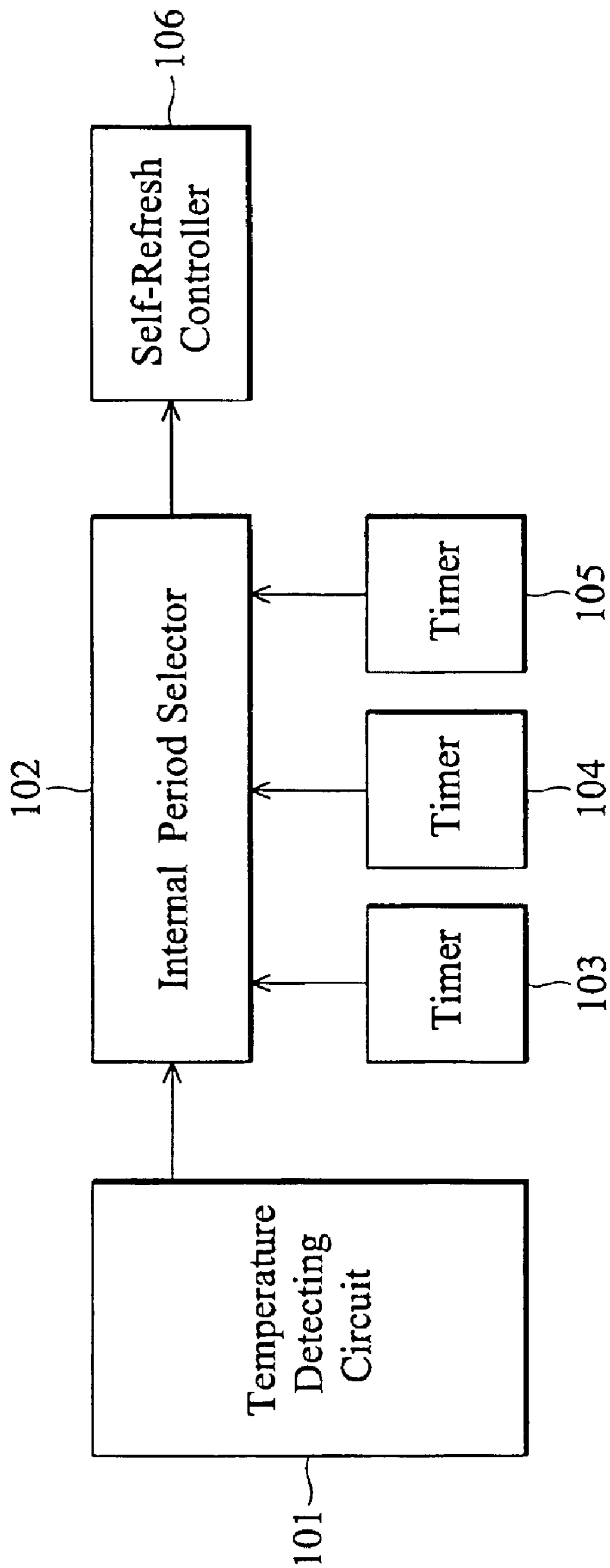
FIG. 10 depicts a block diagram of a self-refresh period control circuit according to another preferred embodiment of the invention.

FIG. 10 is a block diagram showing a circuit for controlling a self-refresh period of a semiconductor memory device according to another preferred embodiment of the invention. The circuit includes a temperature detecting circuit 101, an internal period selector 102, timers 103, 104 and 105, and a self-refresh controller 106. The temperature detecting circuit 101 outputs a temperature detection signal TDS. The internal period selector 102 receives signals PS1, PS2 and PS3 representing different refresh periods and outputting one of the signals PS1, PS2 and PS3 according to the temperature detection signal TDS from the temperature detecting circuit 101. Each of the timers 103~105 generates one of the signals PS1, PS2 and PS3. The self-refresh controller 106 determines a refresh period according to the signal output from the internal period selector 102. In a preferred embodiment, temperature detecting circuit 101 provides similar functionality as circuit shown in FIG. 8.

More specifically, when the ambient temperature is lower than 50° C., the bits OUT1 and OUT2 of the temperature detection signal TDS have a low logic level, and accordingly, the internal period selector 102 selects the signal PS1 as its output to the self-refresh controller 106. As the ambient temperature increases to be higher than 50° C., the bits OUT1 and OUT2 of the temperature detection signal TDS respectively have a low and high logic level, and accordingly, the internal period selector 102 selects the signal PS2 as its output to the self-refresh controller 106. As the ambient temperature further increases to be higher than 70° C., the bits OUT1 and OUT2 of the temperature detection signal TDS have a high logic level, and accordingly, the internal period selector 102 selects the signal PS3 as its output to the self-refresh controller 106. Thus, the self-refresh controller 106 adjusts the refresh period according to the range in which the current ambient temperature is located.

Preferred embodiments of the present invention provide an apparatus for controlling the refresh period of DRAM with a temperature detecting circuit, which occupies a small circuit area and is easy for design. The temperature detecting circuit has voltage dividers and comparators to sense the voltage variation upon temperature so that only one single detecting circuit is used to detect multiple transition temperatures.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A circuit comprising:

a first, second and third voltage divider, each of which comprises resistors having temperature-dependent resistances, outputting a first, second and third voltage; and a voltage comparator comparing the first voltage with the second voltage, and the first voltage with the third voltage and respectively outputting a first and second signal according to the comparison results.

2. A circuit comprising:

a first, second and third voltage divider, each of which comprises resistors having temperature-dependent resistances, outputting a first, second and third divided voltage; and a voltage comparator comparing the first divided voltage with the second divided voltage, and the second divided voltage with the third divided voltage and respectively outputting a first and second signal according to the comparison results, wherein the voltage comparator comprises:

a first transistor of a first type having a source coupled to receive a first voltage;

a second transistor of the first type having a gate coupled to a gate of the first transistor, a source coupled to receive the first voltage and a drain outputting a first bit of a temperature detection signal;

a third transistor of the first type having a gate coupled to the gate of the first transistor, a source coupled to receive the first voltage and a drain outputting a second bit of the temperature detection signal;

a fourth transistor of a second type having a drain coupled to a drain of the first transistor and a gate coupled to receive the first divided voltage;

a fifth transistor of the second type having a drain coupled to the drain of the second transistor, a gate coupled to receive the third divided voltage and a source coupled to a source of the fourth transistor;

a sixth transistor of the second type having a drain coupled to the drain of the third transistor, a gate coupled to receive the second divided voltage and a source coupled to the source of the fourth transistor; and a seventh transistor of the second type having a drain coupled to the drain of the fourth transistor, a gate coupled to receive an enable signal and a source coupled to receive a second voltage.

3. The circuit as in claim 2, wherein the voltage divider comprises:

a first resistor coupled between the gate of the fourth transistor and the source of the first transistor;

a second resistor coupled between the gate of the fourth transistor and the source of the seventh transistor;

a third resistor coupled between the gate of the fifth transistor and the source of the first transistor;

a fourth resistor coupled between the gate of the fifth transistor and the source of the seventh transistor;

a fifth resistor coupled between the gate of the sixth transistor and the source of the first transistor; and a sixth resistor coupled between the gate of the sixth transistor and the source of the seventh transistor.

4. The circuit as in claim 2, wherein the first and second types are P and N type, respectively.

5. The circuit as in claim 2, wherein the first and second voltages are Vdd and a ground voltage, respectively.

6. The circuit as in claim 3, wherein the first, fourth, fifth and sixth resistors are made of poly-silicon.

7. The circuit as in claim 3, wherein the second and third resistors are parasitic resistances of an N well.

8. A circuit comprising:

a pulse generating circuit which outputs a periodic pulse train in response to an external control signal;

a frequency-dividing circuit which outputs a plurality of pulse trains having different periods from each other by frequency-dividing said periodic pulse train output by said pulse generating circuit;

a first, second and third voltage divider, each of which comprises resistors having temperature-dependent resistances, outputting a first, second and third divided voltage;

a voltage comparator comparing the first divided voltage with the second divided voltage, and the second divided voltage with the third divided voltage and respectively outputting a first and second signal according to the comparison results;

a voltage detection circuit which detects a power supply voltage applied to said a memory device and outputs a voltage detection signal when said power supply voltage reaches a predetermined voltage level; and a pulse selection circuit which outputs a self-refresh master clock by selecting one of said pulse trains in response to said first and second signals and said voltage detection signal.

9. The circuit as in claim 8, wherein the voltage comparator comprises:

a first transistor of a first type having a source coupled to receive a first voltage;

a second transistor of the first type having a gate coupled to a gate of the first transistor, a source coupled to receive the first voltage and a drain outputting a first bit of a temperature detection signal;

a third transistor of the first type having a gate coupled to the gate of the first transistor, a source coupled to receive the first voltage and a drain outputting a second bit of the temperature detection signal;

a fourth transistor of a second type having a drain coupled to a drain of the first transistor and a gate coupled to receive the first divided voltage;

a fifth transistor of the second type having a drain coupled to the drain of the second transistor, a gate coupled to receive the third divided voltage and a source coupled to a source of the fourth transistor;

a sixth transistor of the second type having a drain coupled to the drain of the third transistor, a gate coupled to receive the second divided voltage and a source coupled to the source of the fourth transistor; and a seventh transistor of the second type having a drain coupled to the drain of the fourth transistor, a gate coupled to receive an enable signal and a source coupled to receive a second voltage.

10. The circuit as in claim 9, wherein the first and second type are P and N type, respectively.

11. The circuit as in claim 9, wherein the first and second voltages are Vdd and a ground voltage, respectively.

12. The circuit as in claim 9, wherein the first, third, fourth, and sixth resistors are made of poly-silicon.

13. The circuit as in claim 9, wherein the second and fifth resistors are parasitic resistances of an N well.

14. The circuit as in claim 9, wherein the voltage divider comprises:

a first resistor coupled between the gate of the fourth transistor and the source of the first transistor;

a second resistor coupled between the gate of the fourth transistor and the source of the seventh transistor;

a third resistor coupled between the gate of the fifth transistor and the source of the first transistor;

a fourth resistor coupled between the gate of the fifth transistor and the source of the seventh transistor;

a fifth resistor coupled between the gate of the sixth transistor and the source of the first transistor; and a sixth resistor coupled between the gate of the sixth transistor and the source of the seventh transistor.

15. The circuit as in claim 14, wherein the first, fourth, fifth and sixth resistors are made of poly-silicon.

16. The circuit as in claim 14, wherein the second and third resistors are parasitic resistances of an N well.

17. A circuit comprising:

a first, second and third voltage divider, each of which comprises resistors having temperature-dependent resistances, outputting a first, second and third voltage;

a voltage comparator comparing the first voltage with the second voltage, and the first voltage with the third voltage and respectively outputting a first and second signal according to the comparison results;

an internal period selector receiving a plurality of signals representing different periods and outputting one of the signals according to the first and second signals;

a plurality of timers, each generating one of the signals representing the different periods; and a self-refresh controller determining a refresh period according to the signal output from the internal period selector.

18. The circuit as in claim 17, wherein the voltage comparator comprises:

a first transistor of a first type having a source coupled to receive a first voltage;

a second transistor of the first type having a gate coupled to a gate of the first transistor, a source coupled to receive the first voltage and a drain outputting a first bit of a temperature detection signal;

a third transistor of the first type having a gate coupled to the gate of the first transistor, a source coupled to receive the first voltage and a drain outputting a second bit of the temperature detection signal;

a fourth transistor of a second type having a drain coupled to a drain of the first transistor and a gate coupled to receive the first divided voltage;

a fifth transistor of the second type having a drain coupled to the drain of the second transistor, a gate coupled to receive the third divided voltage and a source coupled to a source of the fourth transistor;

a sixth transistor of the second type having a drain coupled to the drain of the third transistor, a gate coupled to receive the second divided voltage and a source coupled to the source of the fourth transistor; and a seventh transistor of the second type having a drain coupled to the drain of the fourth transistor, a gate coupled to receive an enable signal and a source coupled to receive a second voltage.

19. The circuit as in claim 18, wherein the first and second type are P and N type, respectively.

20. The circuit as in claim 18, wherein the first and second voltages are Vdd and a ground voltage, respectively.

21. The circuit as in claim 18, wherein the voltage divider comprises:

a first resistor coupled between the gate of the fourth transistor and the source of the first transistor;

a second resistor coupled between the gate of the fourth transistor and the source of the seventh transistor;

a third resistor coupled between the gate of the fifth transistor and the source of the first transistor;

a fourth resistor coupled between the gate of the fifth transistor and the source of the seventh transistor;

a fifth resistor coupled between the gate of the sixth transistor and the source of the first transistor; and a sixth resistor coupled between the gate of the sixth transistor and the source of the seventh transistor.

22. The circuit as in claim 21, wherein the first, fourth, fifth and sixth resistors are made of poly-silicon.

23. The circuit as in claim 21, wherein the second and third resistors are parasitic resistances of an N well.

24. A circuit comprising:

a first voltage divider comprising a first resistors coupled between a first voltage and a first point and a second resistor coupled between the first point and a second voltage for generating a first voltage from the first point, wherein a temperature coefficient of the first resistor is smaller than that of the second resistor;

a second voltage divider comprising a third resistor coupled between the first voltage and a second point and a fourth resistor coupled between the second point and the second voltage for generating a second voltage from the second point, wherein a temperature coefficient of the third resistor with that of the fourth resistor are the same a third voltage divider comprising a fifth resistors coupled between the first voltage and a third point and a sixth resistor coupled between the third point and the second voltage for generating a third voltage from the third point, wherein a temperature coefficient of the sixth resistor is smaller than that of the fifth resistor; and a voltage comparator comparing the first voltage with the second voltage, and the second voltage with the third voltage and respectively outputting a first and second signal according to the comparison results.

* * * * *